(12) United States Patent
Huang

(10) Patent No.: US 6,611,424 B2
(45) Date of Patent: Aug. 26, 2003

(54) HOUSING OF DATA PROCESSING SYSTEM WITH MECHANISM FOR EASY REMOVAL AND INSERTION OF DISK DRIVE

(75) Inventor: King-Tung Huang, Taipei Hsien (TW)

(73) Assignees: Wistron Corporation, Hsi-Chih (TW); Acer Incorporated, Hsi-Chih (TW)

( * ) Notice: Subject to any disclaimer, the term of this patent is extended or adjusted under 35 U.S.C. 154(b) by 0 days.

(21) Appl. No.: 10/063,941

(22) Filed: May 28, 2002

(65) Prior Publication Data

US 2002/0181197 A1 Dec. 5, 2002

(30) Foreign Application Priority Data

Jun. 1, 2001 (TW) ........................................ 90113408 A

(51) Int. Cl.⁷ ................................................. G06F 1/16
(52) U.S. Cl. ........................ 361/685; 361/683; 361/684; 361/248; 361/224.51
(58) Field of Search ................................ 361/683–686; 248/224.41, 224.51, 224.61

(56) References Cited

U.S. PATENT DOCUMENTS

| | | | | |
|---|---|---|---|---|
| 6,462,670 | B1 | * 10/2002 | Bolognia et al. | 340/815.45 |
| 6,483,107 | B1 | * 11/2002 | Rabinovitz et al. | 250/239 |
| 6,510,050 | B1 | * 1/2003 | Lee et al. | 361/685 |
| 6,535,381 | B2 | * 3/2003 | Jahne et al. | 361/685 |

\* cited by examiner

*Primary Examiner*—Darren Schuberg
*Assistant Examiner*—Yean H Chang
(74) *Attorney, Agent, or Firm*—Winston Hsu

(57) ABSTRACT

A housing of a data processing system with a mechanism for easy removal and insertion of a disk drive, comprises a shell, two opposite guiding plates, a rear plate, and a front plate. A front section of each guiding plate has at least a step-shaped guiding groove. Two opposite side plates of the front plate can slide in the guiding grooves between a first level and a second level. The rear plate and the front plate carries a plurality of front disk drives and rear disk drives. When the front plate slides to the first level of the guiding groove, the front plate is jointed with the rear plate. When the front plate slides to the second level of the guiding groove, the front plate is stepped away from the rear plate so that the front and rear disk drives are both exposed.

17 Claims, 8 Drawing Sheets

HOUSING OF DATA PROCESSING SYSTEM WITH MECHANISM FOR EASY REMOVAL AND INSERTION OF DISK DRIVE

BACKGROUND OF INVENTION

1. Field of the Invention

The present invention relates to a housing of a data processing system, and more particularly, to a housing of a data processing system with a mechanism for easy removal and insertion of a disk drive.

2. Description of the Prior Art

As network systems develop day-by-day, people rely on data processing systems more and more. The data processing system includes personal computers, servers, PDAs, and other devices. A server provides hardware platforms for a virtual private network (VPN), co-location, electronic commerce, ISP, ICP, ASP, and internet gateway, and provides server platforms for client end computers (such as personal computers and PDAs).

Please refer to FIG. 1. FIG. 1 is a perspective view of a 1U server 10 according to the prior art. In order to match with specifications of control rooms, current server producers produce 1U standard servers. The term 1U means the unit height of a server rack inside the control room. One unit is equal to 1.75 inches. Since the standardized 1U servers have light volume, the 1U servers can easily be installed into or removed from the rack. Thus, the 1U servers are popular devices.

The housing of a server 10 is mainly made of metal. The housing comprises a shell 12, two opposite guiding plates 14, and a lower plate 16. A motherboard, a power supply (not shown), and a plurality of disk drives 11, 13 are installed inside the housing of the server 10. Since most severs are designed with hot swap capability, the disk drives 11, 13 inside the server 10 can be removed or inserted during normal operation of the server 10. In order to overhaul and exchange internal components more conveniently, each of two opposite sides of the shell 12 has a sliding rail (not shown). The guiding plates 14 can slide forward and backward along the sliding rails. The lower sides of the guiding plates 14 are connected with two opposite sides of the lower plate 16. When the lower plate 16 receives a pulling force, the lower plate 16 and the two guiding plates 14 slide outward relative to the shell 12 through the cooperation of the guiding plates 14 and the sliding rails. Most of the present servers have the disk drives 11, 13 disposed on the lower plate 16. When the lower plate 16 is pulled out from the shell 12, users can remove the disk drives 11, 13 carried on the lower plate 16 directly and then insert new disk drives.

Please refer to FIG. 2. FIG. 2 is a perspective view of the 1U server 10 in which a front disk drive is removed from the lower plate 16. The 1U server 10 has a thin thickness. If eight disk drives are planned to be disposed inside the server 10, the eight disk drives will be arranged in two rows. That is, a front row and a rear row. Four front disk drives 11 are disposed on the front row, which is near an outer side of the lower plate 16. Four rear disk drives 13 are disposed on the rear row, which is near an inner side of the lower plate 16. Before exchanging the disk drives in the server 10, the lower plate 16 must be pulled out first so that the front disk drives 11 and the rear disk drives 13 can be removed or inserted. Since the front disk drives 11 on the front row are near the outer side of the lower plate 16, users can directly remove or insert the front disk drives 11 in a hot swap manner. However, if users want to exchange the rear disk drives 13, users must remove all of the front disk drives 11 first in order to get enough space for removing or inserting the rear disk drives 13. Since the prior art exchanging method is so inconvenient, most of the present servers have the disk drives disposed in a single row manner. Therefore, the present technology does not allow all front and rear disk drives to be exchanged in a hot swap manner at the same time when the disk drives are arranged in a two-row manner.

This problem arises because the prior art server 10 has a limitation of space. The front and rear disk drives are arranged closely together. The rear disk drives are disposed near the inner side of the lower plate 16, meaning that it is difficult to remove or insert the rear disk drives. Increasing the inner space of the server 10 increases the volume of the server 10 as well. Therefore, a housing with a mechanism which allows the front and rear disk drives inside the server to be easily removed or inserted, and does not increase the volume of the server (data processing system), is a major research topic of computer producers.

SUMMARY OF INVENTION

It is therefore a primary objective of the claimed invention to provide a housing of a data processing system with a mechanism for easy removal and insertion of a disk drive, so as to increase convenience when exchanging disk drives inside the data processing system.

The first embodiment of the claimed invention discloses a housing of a data processing system with a mechanism for easy removal and insertion of a disk drive. The housing comprises a shell, two opposite guiding plates, a rear plate, and a front plate. The shell has two opposite side walls, each with a sliding rail. The two opposite guiding plates are capable of sliding forward and backward along the sliding rails. Rear sections of the two guiding plates are connected to the rear plate. A front section of each guiding plate has at least a step-shaped guiding groove. Two opposite side plates of the front plate can slide between a first level and a second level of the guiding grooves. The rear plate and the front plate carry a plurality of front disk drives and rear disk drives. When the front plate slides to the first level of the guiding groove, the front plate is jointed with the rear plate. When the front plate slides to the second level of the guiding groove, the front plate is stepped away from the rear plate so that the front and rear disk drives are both exposed. Therefore, users can remove or insert the rear disk drives in hot swap manner directly, but do not need to remove all of the front disk drives first.

The second embodiment of the claimed invention housing comprises a shell, two opposite guiding plates, a rear plate, and a front plate. The shell has two opposite side walls, each with a sliding rail. The two opposite guiding plates are capable of sliding forward and backward along the sliding rails. The rear plate carries a plurality of rear disk drives. The front plate carries a plurality of front disk drives. Each of two opposite sides of the front plate has at least a step-shaped guiding groove. The two guiding plates can slide between a first level and a second level of the guiding grooves. When the two guiding plates slide into the second level of the guiding groove, the front plate is jointed with the rear plate. When the two guiding plates slide into the first level of the guiding groove, the front plate is stepped away from the rear plate so that the front and rear disk drives are both exposed. Therefore, users can remove or insert the rear disk drives in a hot swap manner directly, but do not need to remove all of the front disk drives first.

It is an advantage that the claimed invention housing of the data processing system can increase convenience when exchanging the disk drives inside the data processing system. The rear disk drives can be removed or inserted directly, and do not need to have all of the front disk drives removed first. The mechanism of the claimed invention housing makes the exchanging operation more convenient.

These and other objectives of the claimed invention will no doubt become obvious to those of ordinary skill in the art after reading the following detailed description of the preferred embodiment which is illustrated in the various figures and drawings.

DETAILED DESCRIPTION

In order to let examiners have further knowledge of the present invention purpose, characteristics, and efficiency, the present invention is illustrated as follows.

The present invention discloses a housing of a data processing system with a mechanism for easy removal and insertion of a disk drive. The data processing system has a plurality of front disk drives and rear disk drives installed. The mechanism allows exposure of both the front and rear disk drives in the data processing system for removal and insertion. Therefore, the rear disk drives can be removed or inserted easily and are not obstructed by the front disk drives. The present invention increases convenience of removing or inserting the disk drives of the data processing system. For easy illustration, the following uses a 1U standard server as an example of the present invention data processing system. The following illustrates the mechanism for removing or inserting the front and rear disk drives. However, the present invention is not limited to that.

Figure 1:
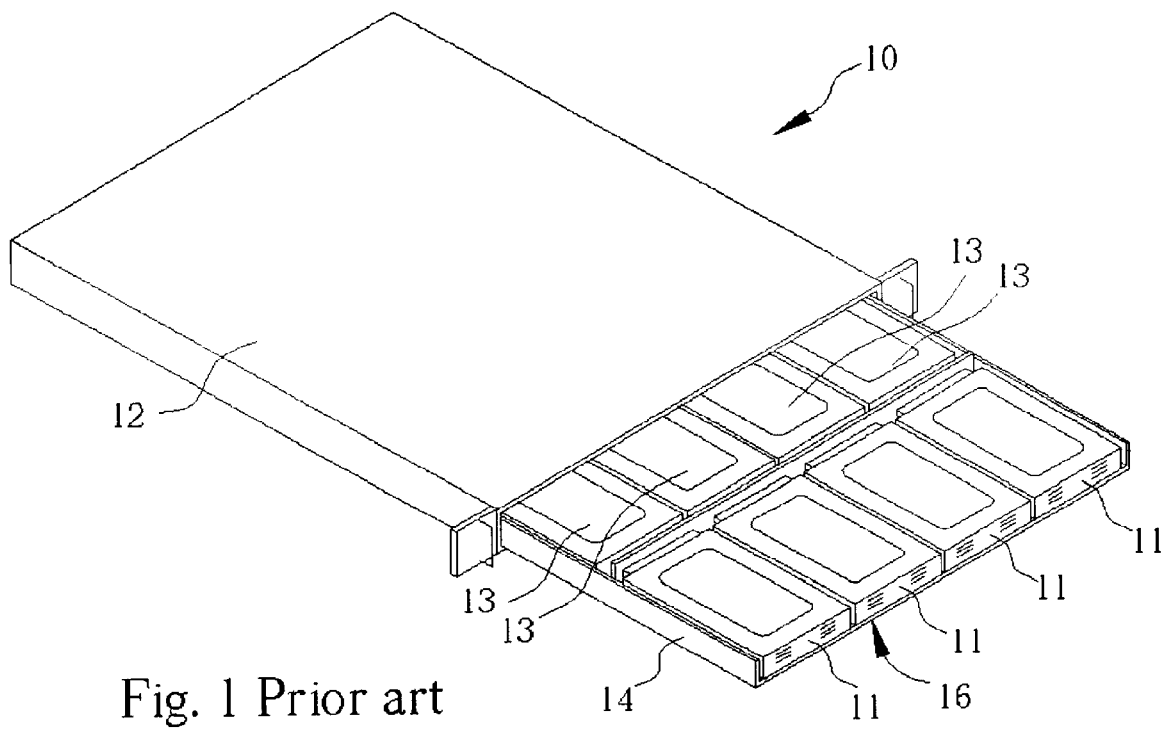
FIG. 1 is a perspective view of a 1U server according to the prior art.
Figure 2:
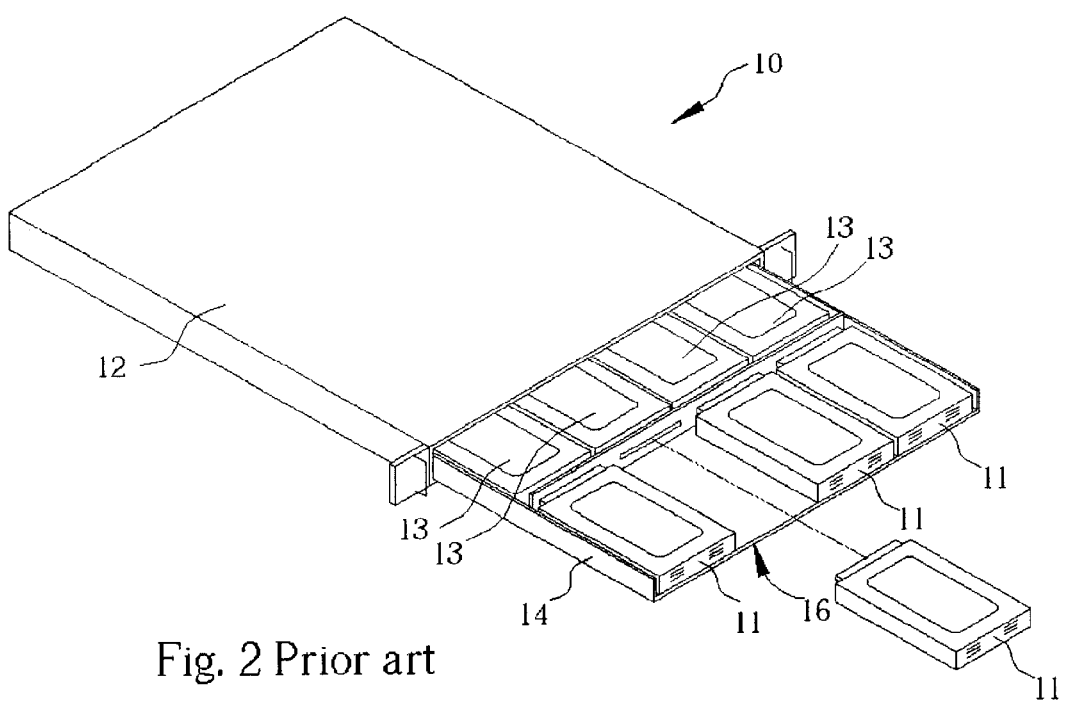
FIG. 2 is a perspective view of the 1U server shown in FIG. 1, in which a front disk drive is removed from the lower plate.
Figure 3:
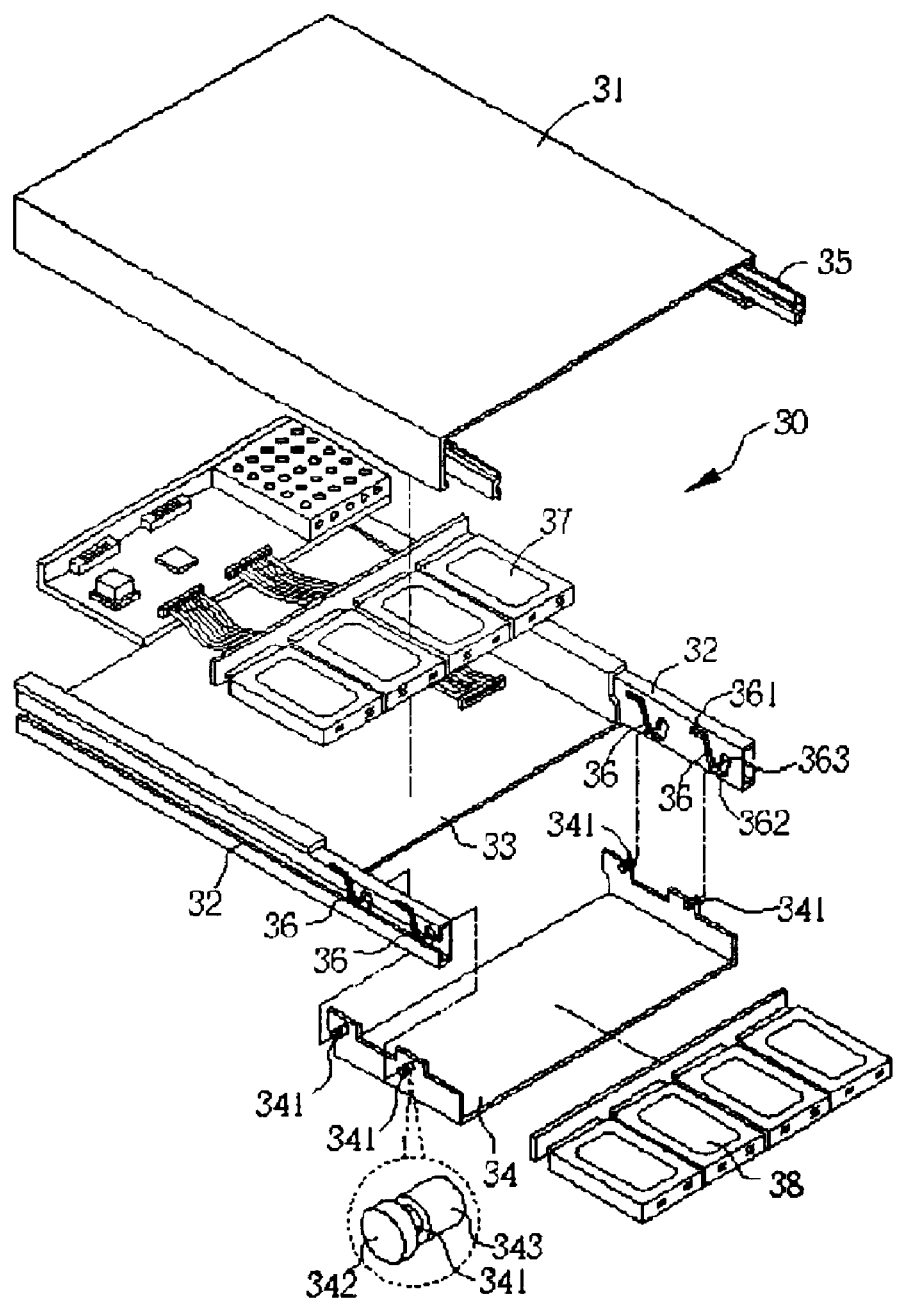
FIG. 3 is a perspective view of a first embodiment of the present invention.

Please refer to FIG. 3. FIG. 3 is a perspective view of a first embodiment of the present invention. The data processing system of the first embodiment is a server 30. The data processing system comprises a shell 31, two opposite guiding plates 32, a rear plate 33, and a front plate 34. The shell has two opposite side walls. An inner side of each side wall has a sliding rail 35. The two sliding rails 35 cooperate respectively with the two guiding plates 32 so that the guiding plates 32 can slide forward and backward on the sliding rails. The rear plate 33 is fixed on rear sections of the guiding plates 32 by using screws or by welding. Alternatively the rear plate 33 is monolithically formed with the rear sections of the guiding plate 32. A front section of each guiding plate 32 has two step-shaped guiding grooves 36, each with a first level 361 and a second level 362. The first level 361 of the guiding grooves 36 is higher than the second level 362 of the guiding grooves 36. Each of two opposite sides of the front plate 34 has two guiding pins 341. The guiding pins 341 can be inserted into the step-shaped guiding grooves 36 so that the guiding pins 341 can slide in the guiding grooves 36 between the first level 361 and the second level 362. Therefore, the front plate 34 can move between a higher position and a lower position relative to the guiding plates 32. Preferably, a flange 342 is formed at an end of each guiding pins 341. The flange 342 has a diameter greater than a diameter of the guiding pins 341 so as to allow the guiding pin 341 to slide in the guiding groove 36 without releasing from the guiding grooves 36 and falling from the guiding plates 32. A sleeve portion 343 is formed around the guiding pins 341. When the guiding pins 341 slide inside the guiding grooves 36, the sleeve portion 343 around the guiding pins 341 rolls inside the guiding groove 36 so as to decrease the friction between the guiding pins 341 and the guiding grooves 36. Therefore, the front plate 34 has a smooth movement. Each guiding groove 36 further contains a hole 363 in order to allow the flange 342 to be inserted into the guiding grooves 36. A diameter of the holes 363 is such that the flanges 342 can just pass through.

Figure 4A:
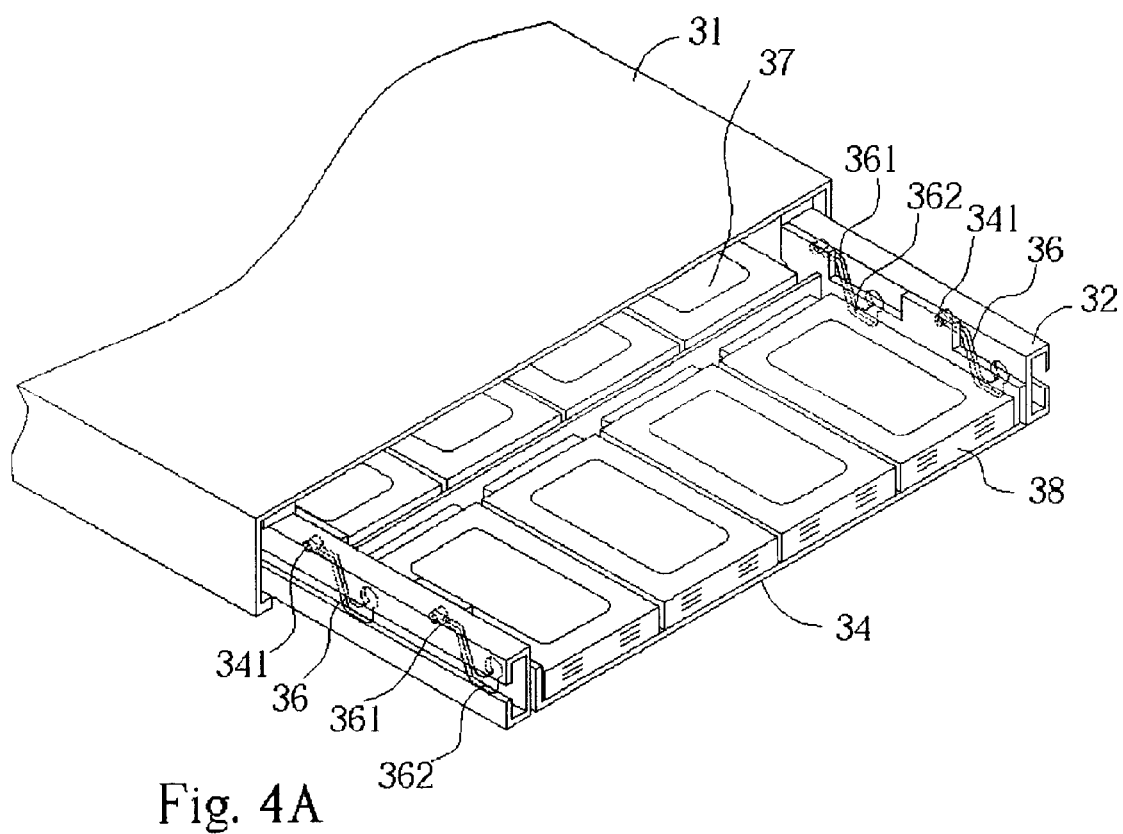
FIG. 4a is a perspective view showing that guiding pins are in the first level of the guiding grooves.
Figure 4B:
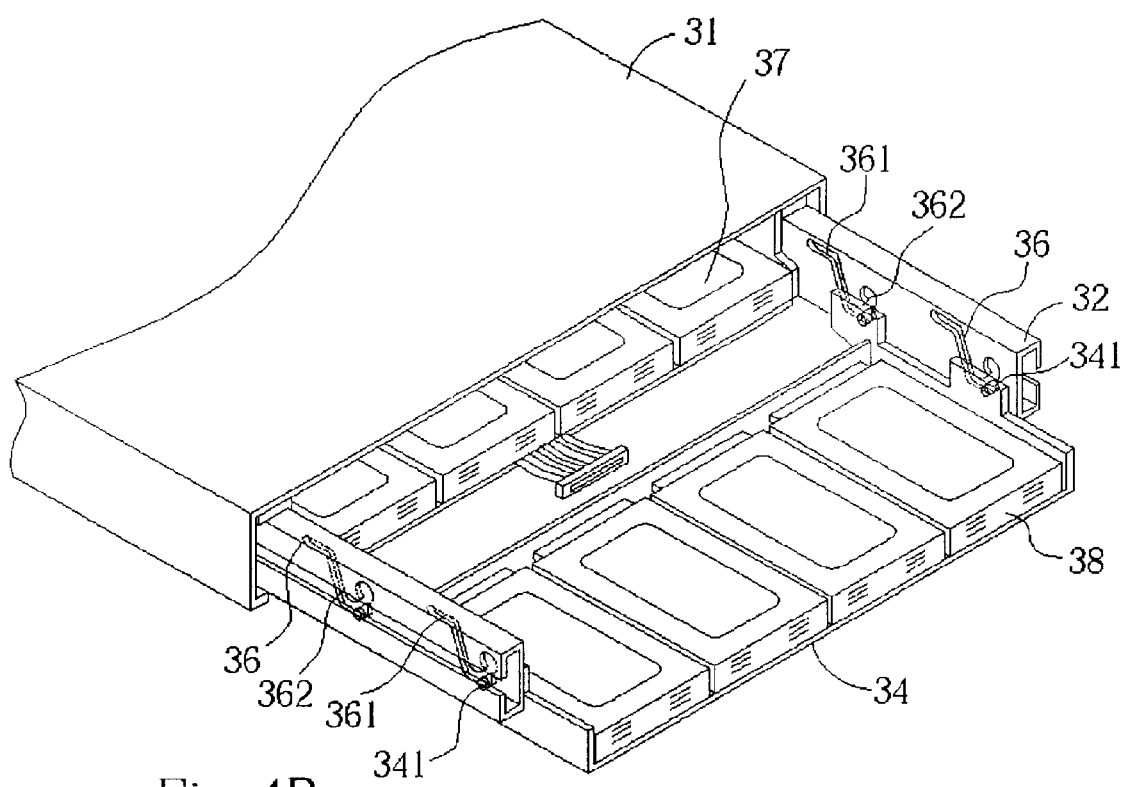
FIG. 4b is a perspective view showing that the guiding pins are in a second level of the guiding grooves.

Please refer to FIG. 4a and FIG. 4b. FIG. 4a is a perspective view showing that the guiding pins 341 are in the first level 361 of the guiding grooves 36. FIG. 4b is a perspective view showing that the guiding pins 341 are in the second level 362 of the guiding grooves 36. The rear plate 33 of the server 30 carries a plurality of rear disk drives 37. The front plate 34 of the server 30 carries a plurality of front disk drives 38. When the guiding pins 341 on the front plate 34 are slid into the first level 361 of the guiding grooves 36, the front plate 34 is jointed with the rear plate 33. At this time, the guiding plates 32 are pushed to make the guiding plates 32 slide into the shell 31 along the sliding rail 35. Therefore, the front and rear plates 34, 33, and the front and rear disk drives 38, 37, can be collected inside the shell 31. When the guiding plates 32 are pulled out from the shell 31 along the sliding rail 35, and the guiding pins 341 on the front plate 34 are slid into the second level 362 of the guiding grooves 36, then the front plate 34 is stepped away from the rear plate 33. At this time, the front and rear disk drives 38, 37 carried on the front and rear plates 34, 33 are both exposed outward. The front disk drives 38 are in a lower position and the rear disk drives 37 are in an upper position. Therefore, users can remove or insert the rear disk drives 37 in a hot swap manner directly, and do not need to remove all of the front disk drives 37 before removing or inserting the rear disk drives 37, as was the case with the prior art.

Figure 5:
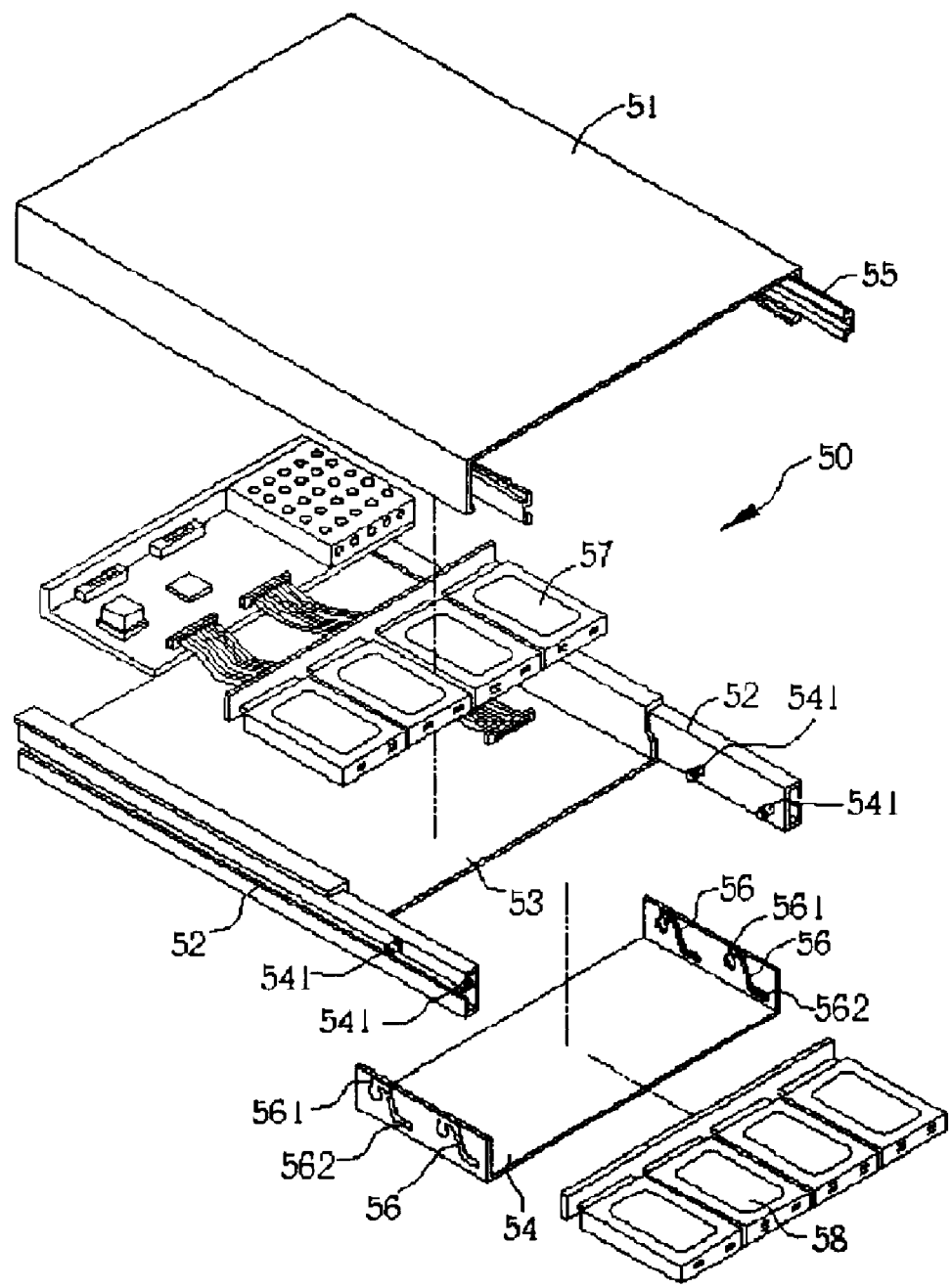
FIG. 5 is a perspective view of a second embodiment of the present invention.
Figure 6A:
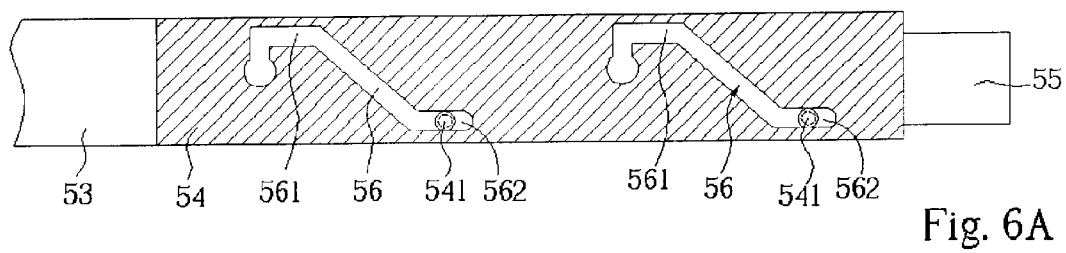
FIG. 6a is a side elevation view showing that guiding pins are in a second level of guiding grooves according to the second embodiment.
Figure 6B:
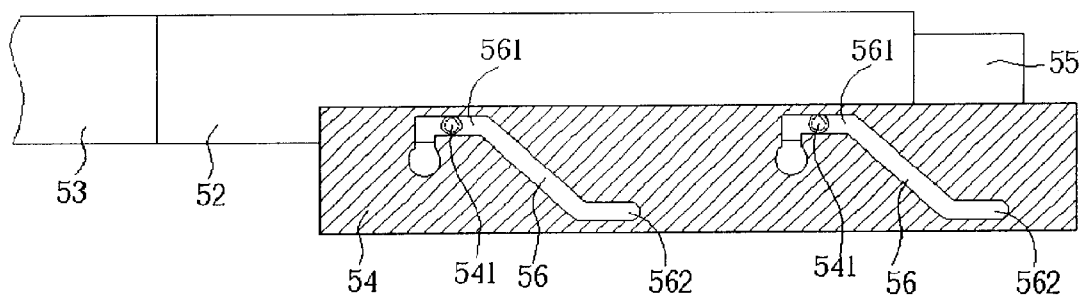
FIG. 6b is a side elevation view showing that the guiding pins are in the first level of the guiding grooves according to the second embodiment.

Please refer to FIG. 5, FIG. 6a, and FIG. 6b. FIG. 5 is a perspective view of a second embodiment of the present invention. FIG. 6a is a side elevation view showing that guiding pins 541 are in a second level 562 of guiding grooves 56 according to the second embodiment. FIG. 6b is side elevation view showing that the guiding pins 541 are in the first level 561 of the guiding grooves 56 according to the second embodiment. The data processing system of the present embodiment is a server 50. The server 50 comprises a shell 51, two opposite guiding plates 52, a rear plate 53, and a front plate 54. The shell 54 has two opposite side walls. An inner side of each side wall has a sliding rail 55. The two sliding rails 55 cooperate respective with the two guiding plates 52 so that the guiding plates 52 can slide forward and backward on the sliding rails 55. The rear plate 53 is fixed on rear sections of the guiding plates 52 by using screws or welding. Alternatively the rear plate 53 is monolithically formed with the rear sections of the guiding plate 52. A front section of each guiding plate 52 has two guiding pins 541. Each of two opposite sides of the front plate 54 has two step-shaped guiding grooves 56. Each guiding groove 56 has a first level 561 and a second level 562. The guiding pins 541 on the guiding plates 52 can be inserted into the step-shaped guiding grooves 56 so that the guiding pins 541 can slide in the guiding grooves 56 between the first level 561 and the second level 562. The first level 561 of the guiding grooves 56 is higher than the second level 562 of the guiding grooves 56. Therefore, the front plate 54 can move between a higher position and a lower position relative to the guiding plates 52. The guiding pins 541 and the guiding grooves 56 of the second embodiment are similar to the guiding pins 341 and the guiding grooves 36 of the first embodiment, only the position of holes of the guiding grooves 36, 56 are different.

The rear plate 53 of the server 50 carries a plurality of rear disk drives 57. The front plate 54 of the server 50 carries a plurality of front disk drives 58. When the guiding pins 541 on the guiding plate 52 slide into the second level 562 of the guiding grooves 56, the front plate 54 is jointed with the rear plate 53 (as shown in FIG. 6a). At this time, the guiding plates 52 are pushed in order to make the guiding plates 52 slide into the shell 51 along the sliding rail 55. Therefore, the front and rear plates 54, 53, and the front and rear disk drives 38, 37, can be collected inside the shell 51. When the guiding plates 52 are pulled out from the shell 51 along the sliding rail 55, and the guiding pins 541 on the guiding plates 52 slide into the first level 561 of the guiding grooves 56, then the front plate 54 is stepped away from the rear plate 53 (as shown in FIG. 6b). At this time, the front and rear disk drives 57, 58 carried on the front and rear plates 54, 53 are both exposed outward. The front disk drives 58 are in a lower position and the rear disk drives 57 are in an upper position. Therefore, users can remove or insert the rear disk drives 57 in a hot swap manner directly, and do not need to remove all of the front disk drives 58 before removing or inserting the rear disk drives 57, as was the case with prior art.

In the first and second embodiments, it is preferable that a length of the guiding plates 32, 52 extends longer than a front edge of the front plates 34, 54 when the front plates 34, 54 are jointed with the rear plates 33, 53 (as shown in FIG. 4a and FIG. 6a). That means, when the guiding plates 32, 52 are pushed inside the shells 31, 51 along the sliding rails 35, 55, and when the front plates 34, 54 and the rear plates 33, 53 are collected inside the shells 31, 51, a front end of the guiding plates 32, 52 remains outside the shells 31, 51. Therefore, the guiding plates 32, 52 can be pulled out easily by pulling the front ends of the guiding plates 32, 52, and the front ends of the guiding plates 32, 52 can be used for installing a panel of the servers 30, 50.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A housing of a data processing system with a mechanism for easy removal and insertion of a disk drive, comprising:
    a shell having two opposite side walls, each with a sliding rail;
    two opposite guiding plates slidable on the sliding rails, a front section of each guiding plate having at least one step-shaped guiding groove, the guiding groove having a first level and a second level;
    a rear plate for carrying at least one rear disk drive, two opposite sides of the rear plate being fixed on rear sections of the guiding plates, the rear plate being capable of moving relatively to the shell through the cooperation of the guiding plates and the sliding rails;
    a front plate for carrying at least one front disk drive, each of two opposite sides of the front plate having at least one guiding pin slidable in the guiding grooves of the guiding plates;
    wherein, when the front plate is in a first position where the guiding pins are in the first level of the guiding grooves, the front plate is jointed with the rear plate; and when the front plate is in a second position where the guiding pins are in the second level of the guiding grooves, the front plate is stepped away from the rear plate so that the front and rear disk drives are both exposed for easy removal and insertion.

2. The housing of claim 1 wherein the data processor is a 1U server.

3. The housing of claim 1 wherein the front section of each guiding plate has two step-shaped guiding grooves and each of the two opposite sides of the front plate has two corresponding guiding pins.

4. The housing of claim 1 wherein the first level of the guiding grooves is higher than the second level of the guiding grooves.

5. The housing of claim 1 wherein a flange is formed at an end of each guiding pin for allowing the guiding pin to slide in the guiding groove without being released therefrom, the flange having a diameter greater than the width of the guiding pin.

6. The housing of claim 5 wherein a sleeve portion is formed around the guiding pin for a smooth relative movement between the guiding pin and the guiding groove.

7. A housing of a data processing system with a mechanism for easy removal and insertion of a disk drive, comprising:
    a shell having two opposite side walls, each with a sliding rail;
    two opposite guiding plates slidable on the sliding rails, a front section of each guiding plate having at least one guiding pin;
    a rear plate for carrying at least one rear disk drive, two opposite sides of the rear plate being fixed on rear sections of the guiding plates, the rear plate being capable of moving relatively to the shell through the cooperation of the guiding plates and the sliding rails;
    a front plate for carrying at least one front disk drive, each of two opposite sides of the front plate having at least one step-shaped guiding groove, the guiding groove having a first level and a second level, the guiding pins of the guiding plates being slidable in the guiding grooves of the front plates;
    wherein, when the front plate is in a first position where the guiding pins are in the second level of the guiding grooves, the front plate is jointed with the rear plate; and when the front plate is in a second position where the guiding pins are in the first level of the guiding grooves, the front plate is stepped away from the rear plate so that the front and rear disk drives are both exposed for easy removal and insertion.

8. The housing of claim 7 wherein the data processor is a 1U server.

9. The housing of claim 7 wherein each of the two opposite sides of the front plate has two step-shaped guiding grooves and the front section of each guiding plate has two corresponding guiding pins.

10. The housing of claim 7 wherein the first level of the guiding grooves is higher than the second level of the guiding grooves.

11. The housing of claim 7 wherein a flange is formed at an end of the guiding pin for allowing the guiding pin to slide in the guiding groove without being position. released therefrom, the flange having a diameter greater than the width of the guiding pin.

12. The housing of claim 11 wherein a sleeve portion is formed around the guiding pin for a smooth relative movement between the guiding pin and the guiding groove.

13. A housing of a data processing system with a mechanism of for easy removal and insertion of a disk drive, comprising:

a shell having two opposite side walls, each with a sliding rail;

two opposite guiding plates slidable on the sliding rails;

a rear plate for carrying at least one rear disk drive, two opposite sides of the rear plate being fixed on rear sections of the guiding plates, the rear plate being capable of moving relatively to the shell through the cooperation of the guiding plates and the sliding rails;

a front plate for carrying at least one front disk drive;

wherein, two opposite sides of the front plate are moveably engaged with front sections of the two guiding plates so that the front plate is moveable relative to the two guiding plates between a first position where the front plate is jointed with the rear plate and a second position where the front plate is stepped away from the rear plate so that the front and rear disk drives are both exposed for easy removal and insertion.

14. The housing of claim 13 wherein the data processor is a 1U server.

15. The housing of claim 13 wherein a front section of each guiding plate has at least one step-shaped guiding groove, and each of the two opposite sides of the front plate has at least one guiding pin slidable in a corresponding guiding groove.

16. The housing of claim 13 wherein each of the two opposite sides of the front plate has at least one step-shaped guiding groove, and a front section of each side plate has at least one guiding pin slidable in a corresponding guiding groove.

17. The housing of claim 13 wherein the first position is higher than the second position.

* * * * *